United States Patent [19]

Masson

[11] 3,916,335

[45] Oct. 28, 1975

[54] HARMONICALLY PHASE LOCKED VOLTAGE CONTROLLED OSCILLATOR

[75] Inventor: Ronald K. Masson, Los Angeles, Calif.

[73] Assignee: Hughes Aircraft Company, Culver City, Calif.

[22] Filed: Sept. 6, 1974

[21] Appl. No.: 503,578

[52] U.S. Cl. .................... 331/4; 325/335; 331/178

[51] Int. Cl.$^2$ .................... H03B 3/04

[58] Field of Search ............ 331/4, 9, 178; 325/335

[56] References Cited

UNITED STATES PATENTS

| | | | |
|---|---|---|---|
| 3,221,266 | 11/1965 | Vitkovits, Jr. | 331/4 |
| 3,375,461 | 3/1968 | Ribour et al. | 331/4 |
| 3,391,348 | 7/1968 | Köhler | 325/335 |
| 3,504,294 | 3/1970 | Martin, Jr. | 331/4 |
| 3,636,467 | 1/1972 | Babany | 331/4 |

*Primary Examiner*—John Kominski

*Attorney, Agent, or Firm*—W. H. MacAllister; Walter J. Adam

[57] ABSTRACT

A highly stable microwave source in which a voltage controlled oscillator (VCO) is harmonically phase locked to a crystal reference source and in which the desired harmonic of the reference source is accurately and reliably selected by sweeping the VCO until it is reached. The reference source, phase comparator, a loop amplifier and VCO are arranged to form the harmonic phase locked loop. A one shot circuit initiates a sweep voltage to sweep the VCO from its initial frequency to either a higher or lower frequency. A marker cavity is provided which responds to the output of the VCO so that when the signal crosses the frequency of the cavity, a flip-flop is set to enable a zero beat detector to provide pulses to increment a counter as each harmonic is crossed. When the count equals a selected digital code, the loop is phase locked to the correct harmonic and a comparator is energized to disconnect the sweep voltage from the VCO. The system operates in one arrangement in accordance with the invention to continue selecting a harmonic until two sweep cycles provide the same VCO control voltage, resulting in a highly reliable selection of the desired harmonic. The selection system in accordance with the invention permits the VCO to have an output bandwidth that is limited only by the VCO tuning range and allows selection of a large number of different harmonics of different reference sources.

10 Claims, 9 Drawing Figures

HARMONICALLY PHASE LOCKED VOLTAGE CONTROLLED OSCILLATOR

BACKGROUND OF THE INVENTION

1. Field of the Invention

This invention relates to microwave signal sources including a voltage controlled oscillator (VCO) and particularly to a VCO harmonically phase locked to a crystal reference source with a VCO sweeping arrangement for accurately and reliably selecting a desired harmonic of the reference source.

2. Description of the Prior Art

Conventional harmonic phase locked voltage controlled oscillators include a reference source, phase comparators, and loop amplifier with an arrangement to sweep the VCO across a harmonic of the reference source. In order to prevent wrong harmonic lock-up, the tuning range of the VCO must be sufficiently limited so that only one harmonic of the reference may be swept across. To obtain wide band operation with this approach, frequency multipliers must be used along with a lower frequency VCO to assure that only one reference harmonic lies within the tuning range of the VCO itself. Even so, severe requirements are placed on the repeatability of the VCO tuning characteristic. This conventional system also has a disadvantage of requiring a separate reference source for every output frequency. A system for providing a selected VCO output frequency that would assure accurate and reliable harmonic lock up in the phase locked loop without multipliers and without restrictions on the VCO tuning characteristic would be a substantial advance to the art.

SUMMARY OF THE INVENTION

The system of the invention includes a selected reference source, a phase comparator, a loop amplifier and a voltage controlled oscillator (VCO) coupled to the loop amplifier to form a harmonic phase locked loop. A portion of the signal out of the VCO is coupled to a microwave cavity which marks a predetermined frequency as the VCO starts sweeping. The sweeping of the VCO past the cavity frequency is detected to set a flip-flop which in turn controls a gate to enable zero beat pulses from the output of the phase comparator to increment a digital counter. A digital comparator responsive to a digital input code and the output of the counter determines when the count equals the digital code, which represents phase lock at the correct harmonic. At this point the sweep terminates. After the first phase lock operation the counter is reset by a one shot circuit and the sweep is repeated to verify the harmonic lock-on condition in response to the control of a second one shot circuit. The system operates with a plurality of selectable reference sources each having a number of selectable input codes for determining which harmonic is to be selected.

It is therefore an object of this invention to provide a harmonically phase locked voltage controlled oscillator system in which the output bandwidth is limited only by the VCO tuning range.

It is a further object of this invention to provide a voltage controlled oscillator responsive to the harmonics of a reference source and having harmonic lock-up in which stringent requirements are not required for the repeatability of the VCO tuning characteristic.

It is a still further object of this invention to provide a harmonically phase locked VCO system in which different harmonics of a few reference sources may be selected rather than having a separate reference source for every output frequency.

It is a still further object of this invention to provide an oscillator and a phase locked loop responsive to harmonics of a reference source controlled so that input cycles may be selected to provide a plurality of harmonic lock-up frequency for each reference source.

BRIEF DESCRIPTION OF THE DRAWINGS

The novel feature of this invention as well as the invention itself both as to its method of organization and method of operation, will best be understood from the accompanying description, taken in connection with the accompanying drawings, in which like reference characters refer to like parts, and in which.

DESCRIPTION OF THE PREFERRED EMBODIMENT

Figure 1A:
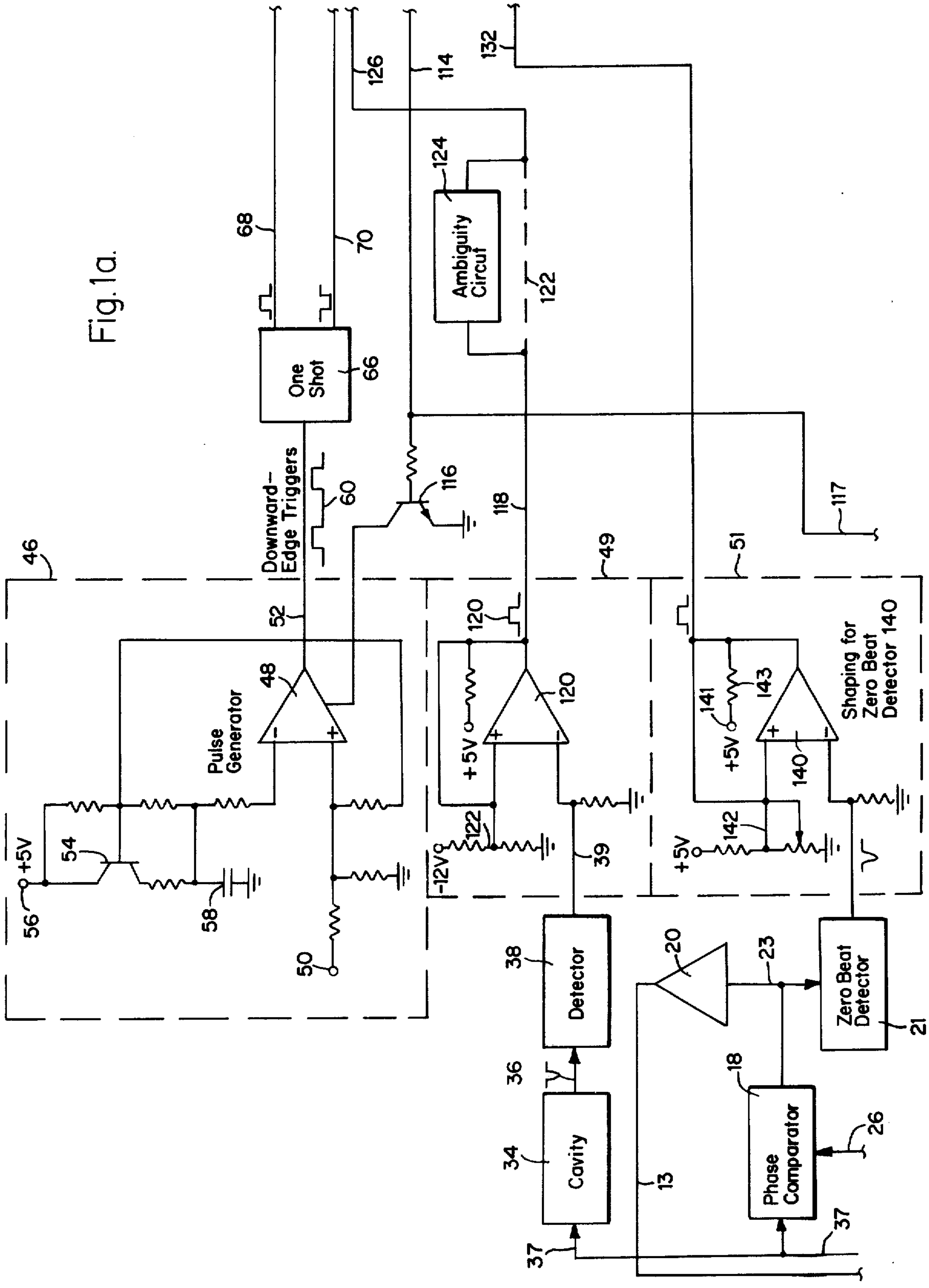
FIGS. 1*a*, 1*b* and 1*c* are schematic block and circuit diagrams showing the harmonic lock-up circuit in accordance with the invention.
Figure 1B:
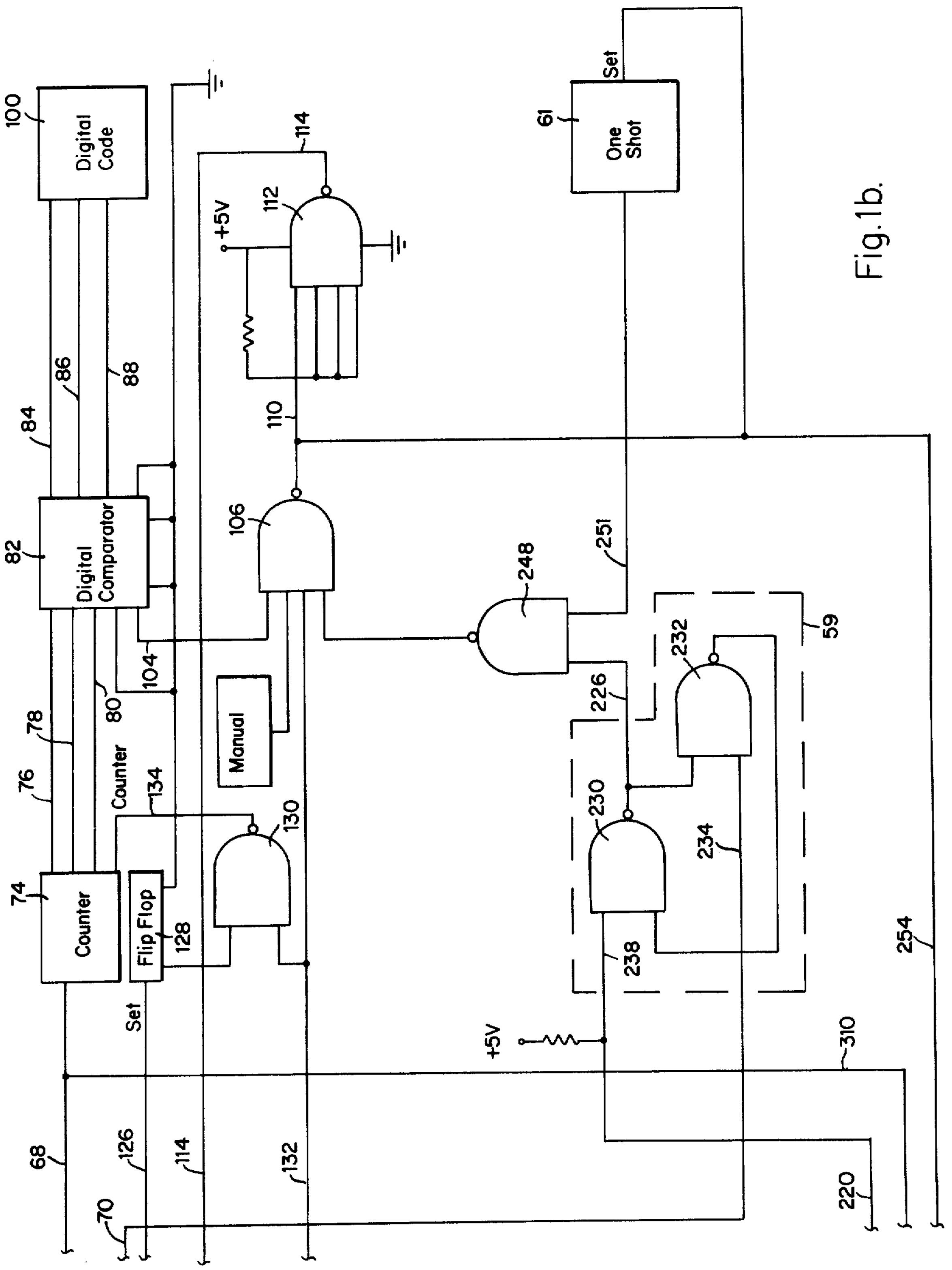
Figure 1C:
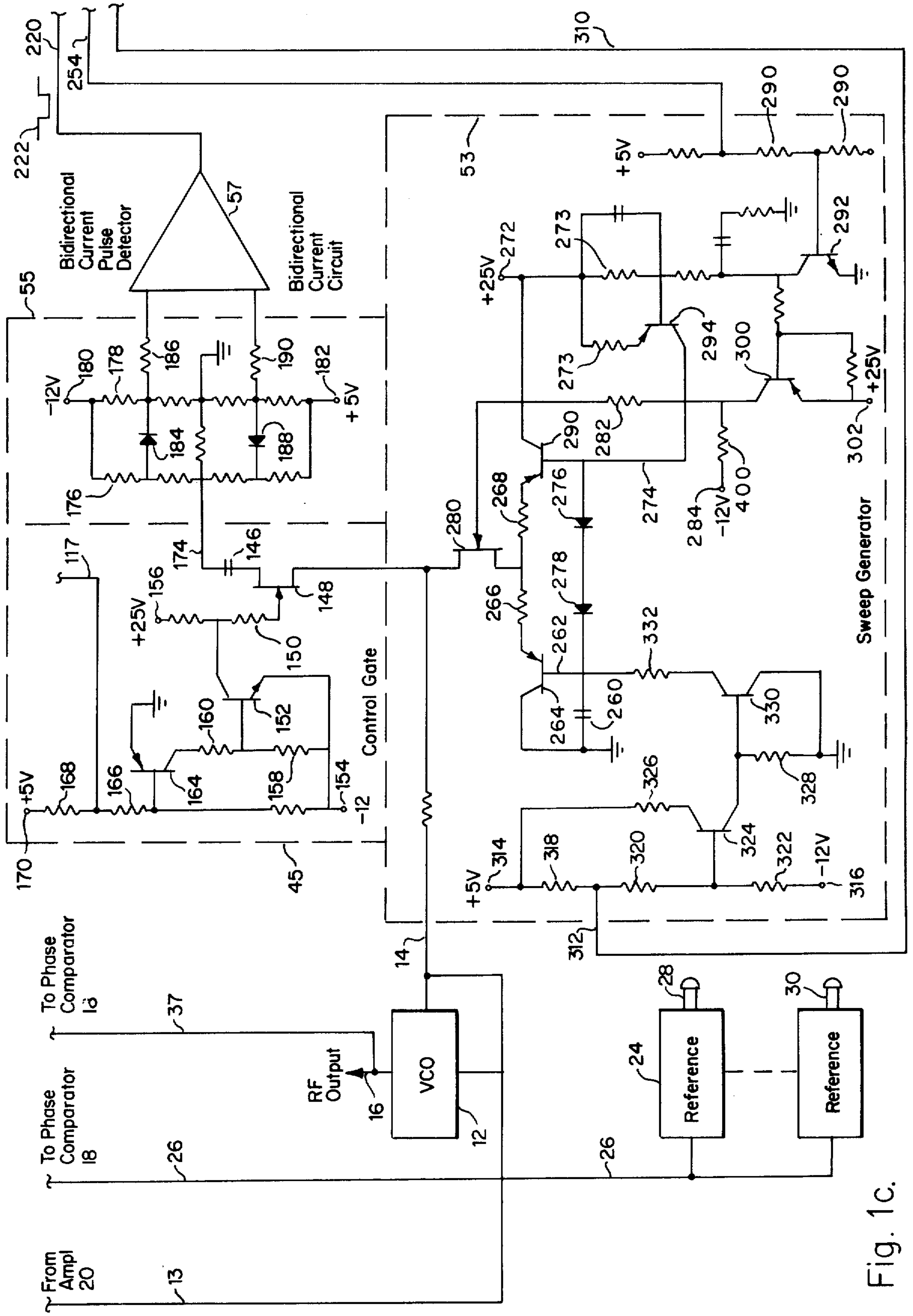

Referring first to FIGS. 1*a*, 1*b* and 1*c*, a voltage controlled oscillator (VCO) 12 which may be of any plurality of conventional types of oscillators varying frequency in response to a control signal voltage, has a control input lead 14, and an output lead 16 which for example may be a coaxial line and is coupled through a lead 37 to a phase comparator 18. A loop amplifier 20 coupled from the output of the phase comparator 18 through a lead 13 to the control lead 14 provides a harmonic phase locked loop in combination with the VCO 12 so that the voltage control oscillator remains locked on a selected harmonic of a reference source such as 24 which is coupled through a lead 26 to the phase comparator 18. The reference source 24 may include a plurality of sources such as 28 and 30 each having a suitable control for being turned on to apply the corresponding signal to the lead 26. The RF (radio frequency) lead 16 which passes to a suitable output (not shown) is also coupled through the lead 37 to a microwave cavity 34 for providing a pulse of the waveform 36 at a selected frequency which is applied to a detector 38.

The system generally includes a pulse generator 46 for initiating operation, a cavity response shaper 49 for applying cavity pulses to a flip-flop 128 which in turn controls a counter 74 to apply count signals to a digital comparator 82. A zero beat detector 51 applies pulses to the counter 74 and a sweep generator 53 controls the VCO 12. Further a control circuit 45, a bi-directional current detector circuit 55 and a flip-flop pulse detector 59 controls the system to provide a second sweep cycle to verify that it is locked to the correct harmonic and to correct the system when transients may cause an error. Control signals employed internally are provided by a one shot circuit 61 and a one shot circuit 66.

In order to sweep the VCO 12 and initiate operation for selecting desired harmonics and for overcoming the effects of transient signals, the system includes the pulse generator 46 which may be of any suitable type as well known in the art, and may include a comparator 48 with its positive input coupled to a suitable +5 volt source 50 as well as being coupled to an output lead 52. The negative input terminal may be coupled to the emitter of a transistor 54 having its base coupled to the lead 52, its collector coupled to a suitable +5 volt source 56 and its emitter coupled through a control capacitor 58 to ground. Other suitable biasing arrangements may be provided as required by the comparator circuit such as having the base of the transistor 54 coupled through a resistor 51 to the capacitor 58 in turn coupled through a resistor 53 to the negative terminal of the comparator 48. In response to the timing provided by the capacitor 58 a pulse train of a waveform 60 is developed. Each pulse occurs while the potential at the negative input terminal is below the potential at the positive input terminal. These pulses of the waveform 60 are applied through the lead 52 to the trigger terminal of a one shot circuit 66 which may trigger on the tracking edge of the input pulse. The one shot circuit 66 may be of any conventional type to provide a pulse on an output lead 68 and complimentary pulse on an output lead 70 with the lead 68 being coupled to a reset terminal of the counter 74, which may be any suitable counter such as a digital counter as is well known in the art. The count stored in the counter 74 is applied through suitable output leads such as 76, 78 and 80 to a digital comparator 82 which compares the count to an input code applied through the leads 84, 86 and 88 from a control source 100. The count may be either stored in a register in the comparator 82 or in the register in the control unit 100, the latter may be controlled either manually or automatically to provide desired count codes for operating on selected harmonics. The digital comparator 82 may be any conventional arrangement such as a circuit that provides a subtraction of the two input numbers to provide a 1 at the output or outputs only upon the determination of equality of the two input numbers. The output signal may be applied through a lead 104 to a main control gate 106 which may be of any suitable type of gate but which in the illustrated arrangement is a NAND gate.

Figure 3:
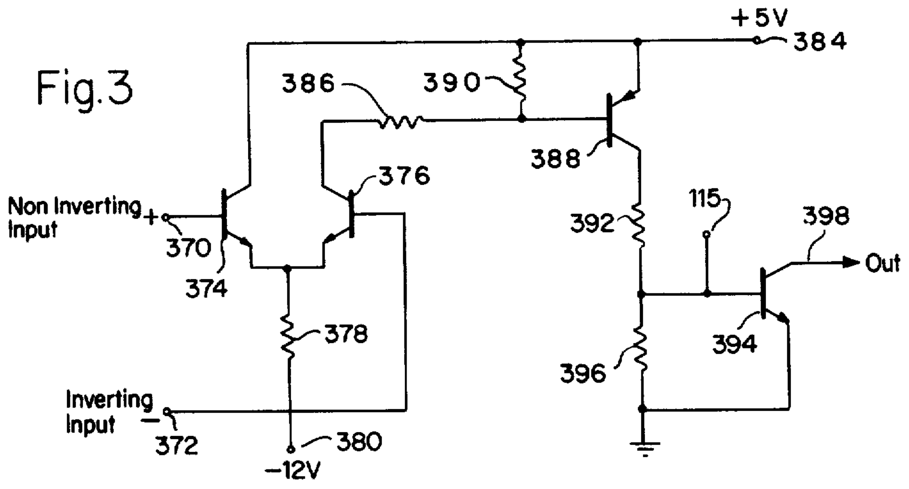
FIG. 3 is a schematic circuit diagram of a typical comparator circuit that may be utilized in the system of FIG. 1.

The output of the NAND gate 106 which goes to a low potential level only when all the input terms are at high levels is applied through a lead 110 to a NAND gate 112 operating as an inverter and through a lead 114 and a transistor 116 and a lead 115 to the control terminal of the comparatoor 48 of the pulse generator 46. A positive signal on the lead 114 sets the output of the comparator 48 positive which is the high level of the pulse of the waveform 60 (FIG. 3).

The cavity shaper 49 responds to the negative pulse provided by the cavity 34 and detected by the detector 38, to apply a positive pulse of a waveform 120 output lead 118 for setting a flip-flop 128 and starting the counting operating in accordance with the invention. The cavity shaper 49 may include a comparator 120 suitably biased by a resistive network and voltage source 122 coupled to the positive input terminal. The negative terminal may be coupled through a lead 39 from the detector 38. A cavity pulse of the waveform 120 is applied to the lead 118 and through a dashed lead 122 or an ambiguity selecting circuit 124 to the lead 126 and in turn to the flip-flop 128, which flip-flop is set in response to the cavity pulse. The output of the flip-flop 128 is applied to a NAND gate 130 which also receives the zero beat pulses from the zero beat detector 51 on the lead 132, which pulses are applied to the toggle input terminal of the counter 74 on a lead 134 during the period that the flip-flop 128 is set. The main control gate 106 also receives zero beat detector pulses on the lead 132 so that lock-up is provided in response to a zero beat detector pulse as the count changes to match the input code.

The zero beat detector 21 in response to the phase comparator 18 applies negative pulses to the shaping circuit 51 which for example may include a comparator 140 with its negative terminal coupled to the zero beat detector 21 and its positive terminal coupled to a bias source 142 a +5 volt source 141 is coupled through a resistor 143 to the lead 132.

The control gate 45 which receives the main gate signal on the lead 114 includes a capacitor 146 coupled at one end to one terminal of a FET (Field Effect Transistor) 148 with the other terminal of a transistor coupled to the VCO control lead 14. The gate terminal of the FET 148 is coupled through a resistor 150 to the collector of an NPN transistor 152 having its emitter coupled to a −12 volt terminal 154. The collector of the transistor 152 is also coupled through a suitable resistor to a +25 volt source 156 and the base is coupled through a resistor 158 to the terminal 154 as well as through a resistor 160 to the collector of a PNP type transistor 164. The emitter of the transistor 164 is coupled to ground and the base is coupled through a suitable resistor to the −12 volt terminal 154 as well as through a resistor 166 to the lead 114, which lead is also coupled through a resistor 168 to a +5 volt terminal 170. The other terminal of the capacitor 146 is coupled through a lead 174 to the bi-directional current detector circuit 55 which is in turn coupled to the bi-directional current detector circuit 55 which is in turn coupled to the bi-directional pulse detector 57. The circuit 55 includes a series resistance circuit 176 and a series resistance circuit 178 coupled between a −12 volt terminal 180 and +5 volt terminal 182 with the center of the series circuit 176 coupled to the lead 174 and the center of the series 178 coupled to ground. In the top portion of the series circuit 176, a diode 184 is coupled therebetween and to a resistor 186 to the negative input terminal of the comparator 57 at the bottom of the circuit 176, a diode 188 of opposite polarity from the diode 184 has a cathode coupled to the series circuit 176 and an anode coupled to the series circuit 178 as well as through a resistor 190 to the positive terminal of the comparator 57. In operation, the positive potential on the lead 174 passes current through the diode 184 to the −12 terminal and the negative terminal potential increases above the potential at the positive terminal forms an output pulse from comparator 57. Similarly in response to a negative potential on the lead 174, current passes through the diode 188 from the +5 volt terminal 182 and the voltage at the positive terminals increases above the potential at the negative terminal to form an output pulse. For either direction of current flow in capacitor 146, the values of the resistors are selected so that the polarity of the signals applied to the amplifier 57 remains constant to provide a negative pulse on the output lead 220 of the comparator 57.

The flip-flop 59 responds to a negative pulse of a waveform 222 on a lead 220 to set the flip-flop to provide a high level signal on output lead 226 to cause the system to provide another sweep cycle of the VCO. The flip-flop 59 which may be of any conventional type is illustrated as including NAND gates 230 and 232 coupled in a conventional set-reset arrangement with a lead 234 at the input of the NAND gate 232 providing a reset terminal and the terminal 238 of the gate 230 providing a set terminal that is coupled to the lead 220.

For further controlling the main gate 106, a NAND gate 248 has one end of the terminal coupled to the lead 226 and a second input terminal coupled to the output terminal of the one shot circuit 61. The one shot circuit 61 has a set input terminal coupled through a lead 254 to the output of the main control gate 106. The gate 248 in response to a signal from the flip-flop 59 and from the one-shot circuit 61 maintains a high level signal on an input of the main gate 106 prior to system lockup and during the response time of the bi-directional current pulse detector but maintains a low signal if flip-flop 59 has been set by the bi-directional current pulse detector 57 and the one-shot pulse 61 has ended. One function of the gate 248 is to provide a control for developing a second sweep to provide assurance that the correct harmonic is being locked onto.

The sweep generator 53 includes a capacitor 260 having one terminal coupled to ground and the other terminal coupled to a lead 262 which in turn is coupled to the base of a PNP type transistor 264 having a collector coupled to ground. The emitter of the transistor 264 is coupled through resistors 266 and 268 to the emitter of an NPN type transistor 270 having its collector coupled to a +25 volt terminal 272 and its base coupled to a lead 274 as well as through the anode to cathode paths of diodes 276 and 278 to the lead 262 to provide a constant voltage difference. An FET transistor 280 has a first terminal coupled to a point between the resistors 266 and 268 and a second terminal coupled to the VCO control lead 14 and the gate terminal coupled through resistor 282 to the collector of PNP transistor 300. To start the sweep operation the lead 254 is coupled to a voltage divider 290 which in turn is also coupled to the base of an NPN type transistor 292 having its emitter coupled to ground and its collector coupled through a suitable biasing arrangement to the base of a PNP type transistor 294. The emitter of the transistor 294 is coupled to the +25 volt terminal 272 through resistor 273 and the collector is coupled to the lead 274 to control the base of the transistor 290. The collector of the transistor 292 is also coupled through a suitable resistor to the base of a PNP type transistor 300 having its emitter coupled to a +25 volt terminal 302 and its collector coupled to the resistor 282 and to the −12 terminal through resistor 400. Thus, a positive voltage on the lead 254 causes a transistor 292 and 294 to conduct and causes the transistors 270 and 264 to conduct at greater increasing amounts as the capacitor 260 is charged. The resistor 273 provides a constant current source so that the voltage on the capacitor controls the sweep voltage in a linear fashion.

For restarting the sweep, a lead 310 receives a signal from the lead 68 which is applied through a voltage divider 312 coupled between a +5 volt terminal 314 and a −12 volt terminal 316. The voltage divider 312 includes resistors 318, 320 and 322 with the lead 310 coupled between the resistors 318 and 320. An NPN type transistor 324 has its base coupled between the resistors 320 and 322 and its collector coupled through a resistor 326 to the +5 volt terminal 314. The emitter of the transistor 324 is coupled through resistor 328 to ground as well as to the base of an NPN type transistor 330 having its emitter coupled to ground and its collector coupled through resistor 332 to the lead 332 for discharging the capacitor 260. Thus, in operation the transistor 292 is biased as a conducting switch to provide a known current flow through the resistor 273 and the transistor 294 through the lead 274, the diodes 276 and 278 which provide a known voltage drop or differential and onto the plate of the capacitor 260. Transistors 264 and 290 provide amplification to generate a sweep which is passed through the gate 280, which sweep continues until it is reset by the transistor 330 being biased into conduction to discharge the capacitor 260. The FET 280 remains biased in conduction while the transistor 292 is biased in conduction as a result of the potential applied from the collector of the transistor 300 to the base of the FET 280.

Figure 2:
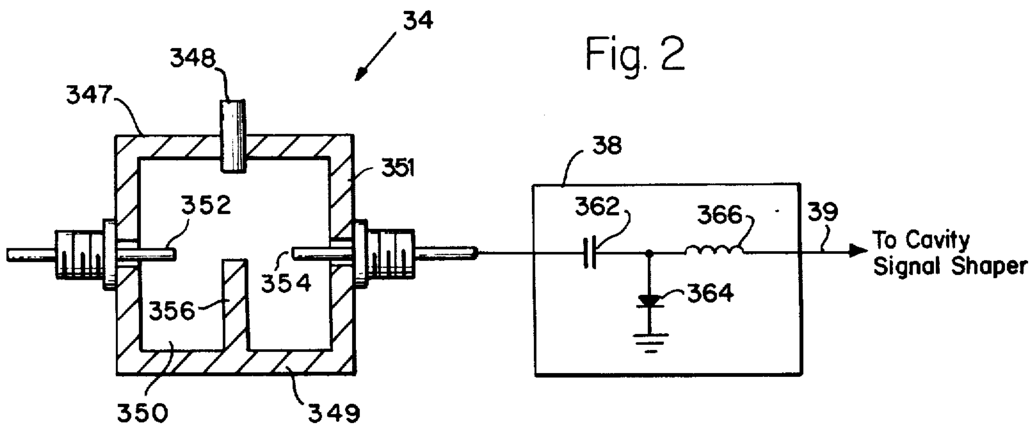
FIG. 2 is a schematic side view, partially broken away, of the microwave cavity that may be utilized in the system of FIGS. 1*a*, 1*b* and 1*c*.

FIG. 2 shows a cutaway view of the cavity 34 for providing a pass band at a selected resonant frequency that will allow starting of the counting operation at a predetermined harmonic of the reference source. The cavity 34 which is cylindrically shaped with the top and bottom being surfaces 347 and 349 and the cylindrical surface being a surface 351, includes an internal cavity enclosure 350 responsive to an input probe 352 coupled to the input lead 161 to provide an internal TEM mode as is well known in the art. The output signal from the tuned cavity is sensed by a probe 354 and applied through an output lead to the detector 38. As is well known in the art, the resonant frequency is determined principally by the length of center post 356 relative to the outer tuning post 358. The pulse width of the tuned cavity is determined principally by the ratio of internal diameter (post outer diameter) over the outer diameter (internal diameter of the cavity). Cavities to provide a selected bandpass are well known in the art and it will not be explained in further detail. The detector 38 may include a capacitor 362 coupled to the output of the cavity 34 at one end and coupled at the other end through a microwave diode 364 to ground. The other end or plate of the capacitor 62 is also coupled through an inductive choke 366 to the lead 39. The detected signal is then applied to the cavity response shaper circuit 49.

Referring now to the comparator circuit of FIG. 3 which is an illustration of a basic unit that may be utilized to provide the pulse generator 46, the cavity shaper 49, the shaping and zero beat detector unit 51 and the bi-directional current pulse detector 57. The comparator includes a positive non-inverting input 370 and negative inverting input 372 respectively coupled to the bases of NPN type transistors 374 and 376 having their emitters coupled through a resistor 378 to a −12 volt supply terminal 380. The collector of the transistor 374 is coupled to a +5 volt supply terminal 384 and the collector of the transistor 376 is coupled through a resistor 386 to the base of a PNP type transistor 388, the base also being coupled through a resistor 390 to the +5 volt supply terminal 384. The emitter of the transistor 388 is coupled directly to the terminal 384 and the collector of that transistor is coupled through a resistor 392 to the base of an NPN type transistor 394 the base thereof being coupled through a resistor 396 to ground. The transistor 394 has its emitter coupled to ground and its collector coupled to an output lead 398 to provide the output terminal to each of the units in which the comparator is utilized. The base of the transistor 394 is further coupled to a lead 115 in the pulse generator 46 to provide the control terminal for the pulsing operation.

In the pulse generator 46, the positive terminal receives positive feedback from the output and the negative terminal provides a changing value for comparison which results in pulses being formed with the capacitor 58 providing a time control for determining the width and time between the pulses. In the cavity shaper 49, the negative terminal provides a threshold and when the cavity signal on the lead 39 exceeds that threshold in magnitude a pulse is generated. In the zero beat detector circuit 51, a bias is provided at the positive terminal and when the zero beat detector provides a negative pulse (above ground) that decreases below that bias voltage, a pulse is formed. In the bi-directional current pulse detector 57, either when a potential at the negative terminal or the positive terminal crosses the other, a negative pulse is formed at the output lead 220. The operation of these types of pulse forming circuits is well known in the art and will not be explained in further detail.

Figure 4:
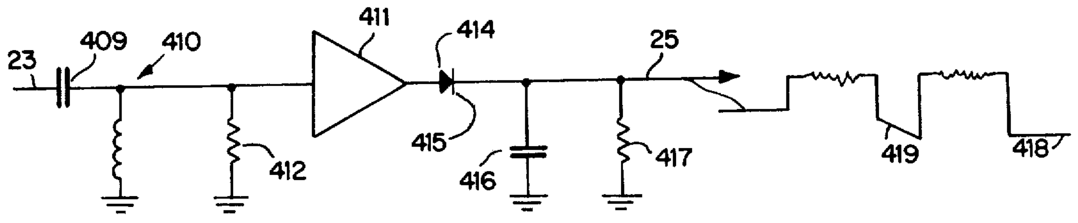
FIG. 4 is a schematic circuit diagram of a zero beat detector having a high pass filter characteristic that may be utilized in the system of FIG. 1.

Referring now to FIG. 4 which is an illustration of a zero beat detector 21 that operates as a high pass filter to detect the occurrence of a phase lock condition of the VCO control loop, the signal on a lead 23 from the phase comparator 18 is applied through a capacitor 409 of a high pass filter 410 to a high frequency amplifier 411. The high pass filter also includes a resistor 412 coupled from the input of the amplifier 411 to ground. The signal is applied from the amplifier 411 through a diode 414 of a peak detector 415 to the output lead 25. The peak detector also includes a capacitor 416 and a resistor 417 coupled from the lead 25 to ground. When the loop is not phase locked, the output of the phase comparator 18 provides a substantial number of beat frequencies so that the output has a relatively high level, as shown by a waveform 418, but upon phase lock the high level falls so that a pulse 419 is developed at the output of the zero beat detector.

Figure 5:
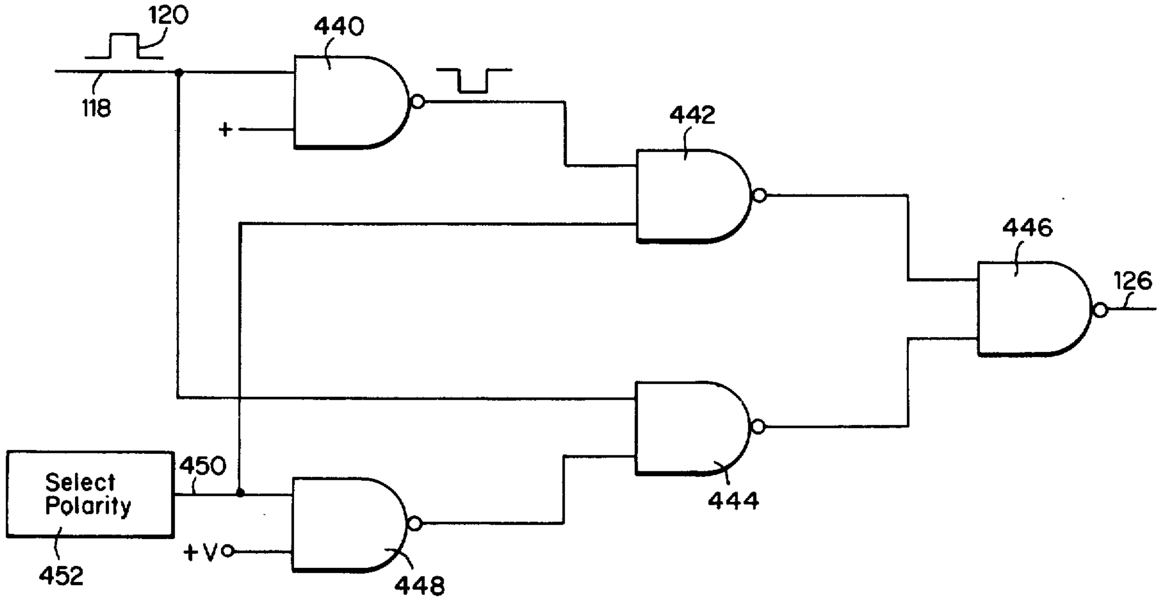
FIG. 5 is a schematic diagram of an ambiguity circuit that may be utilized to initiate counting of harmonic pulses on either the leading or tracking edge of cavity crossing.

Refer now to FIG. 5 which shows the ambiguity circuit 124 that may allow the system of FIG. 1 to start counting on either the leading or trailing edge of the cavity pulse, a condition that may be required by the positioning of certain reference frequency harmonics with respect to the cavity response. The lead 118 is coupled to an inverting gate 440 as one input to a NAND gate 442 as well as being directly coupled to a NAND gate 444 with both of the outputs of NAND gates 444 and 442 being coupled to a NAND gate 446 and to the output lead 126. A control NAND gate 448 operating as an inverter has its output coupled as a second input to the NAND gate 444 and its input control on a lead 450 from a source 452 being directly coupled as a second input to the NAND gate 442. Thus by a selection operation which may be either automatic or manual in the unit 452, a high pulse is supplied to the lead 450 provides a pulse going from the high logic level to zero volts at the output lead 126, while 0 volts on lead 450 provides a pulse going from zero to the high level at lead 126. Since flip-flop 128 sets on the downward-going edge of the waveform at lead 126, the effect of changing the logic signal on lead 450 is to cause the system of the invention to start counting harmonics from the other edge of the cavity crossing, as may be determined to be useful with certain frequencies of operation.

Figure 6:
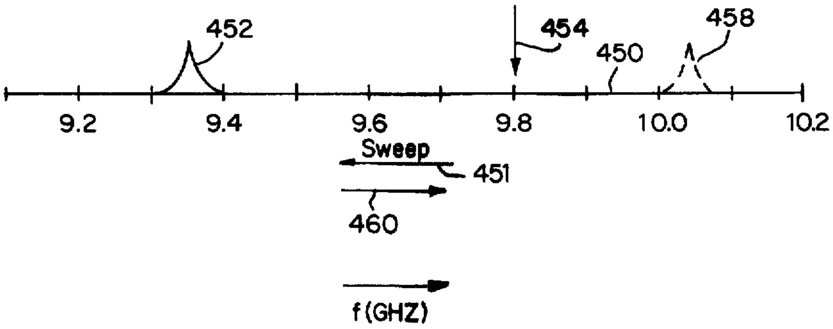
FIG. 6 is a spectral diagram of amplitude as a function of frequency for further explaining the operation of the harmonic lock up in the system of FIG. 1.

Referring now to FIG. 6 which is a spectral diagram for further explaining the sweeping operation of the VCO, the general system operation will be further described. As an illustrative example the crystal oscillator or reference source may be at 100 Mhz (megahertz) resulting in the VCO being at N × 100 where N is an integer, and it may be desired to operate in the range where N is 96, 97 and 98. Thus the fixed reference harmonics for the spectral diagram 450 may be 9.0 GHz (Gigahertz), 9.1, 9.2 GHz up to 10.0 GHz with the operation to be selected at a harmonic above 9.3 GHz. The VCO is reset to some point such as 9.0 GHz and the sweep of an arrow 460 in the illustrated example increases the frequency out of the VCO to 9.3 GHz and then into the cavity passband as indicated by the cavity marker pulse 452. In response to the cavity marker pulse 452, the counter is enabled to count harmonics as the sweep continues. As an example, if is desired to operate at 9.8 GHz, as shown by the arrow 454, the system will lock up the VCO when the counter arrives at a count of 5. By placing any code into the system of the invention, any of the harmonics above the marker pulse 452 may be selected. At different reference frequencies that may be selected, the harmonics may be differently spaced so that, as previously discussed, if the first harmonic conflicts in position with the marker cavity 452, either the leading or trailing edge of the cavity pulse may be selected for starting the counting operation. Once a particular harmonic is selected, the phase lock loop controls and the system remains locked thereon unless transient or noise signal should cause the system to lose phase lock, in which case the system automatically repeats its operation to lock on the correct selected harmonic. In the illustrated system, the sweep cycle is performed twice to automatically assure that the correct harmonic has been selected. It is also to be noted that the system is not limited to sweeping across the cavity and up to a higher frequency of the VCO output but may be arranged according to the principles of the invention to sweep from a higher frequency across the marker cavity and down to a lower frequency until the correct harmonic is selected. This implementation is indicated by the dotted cavity response curve and sweep direction shown by arrow 451.

Figure 7:
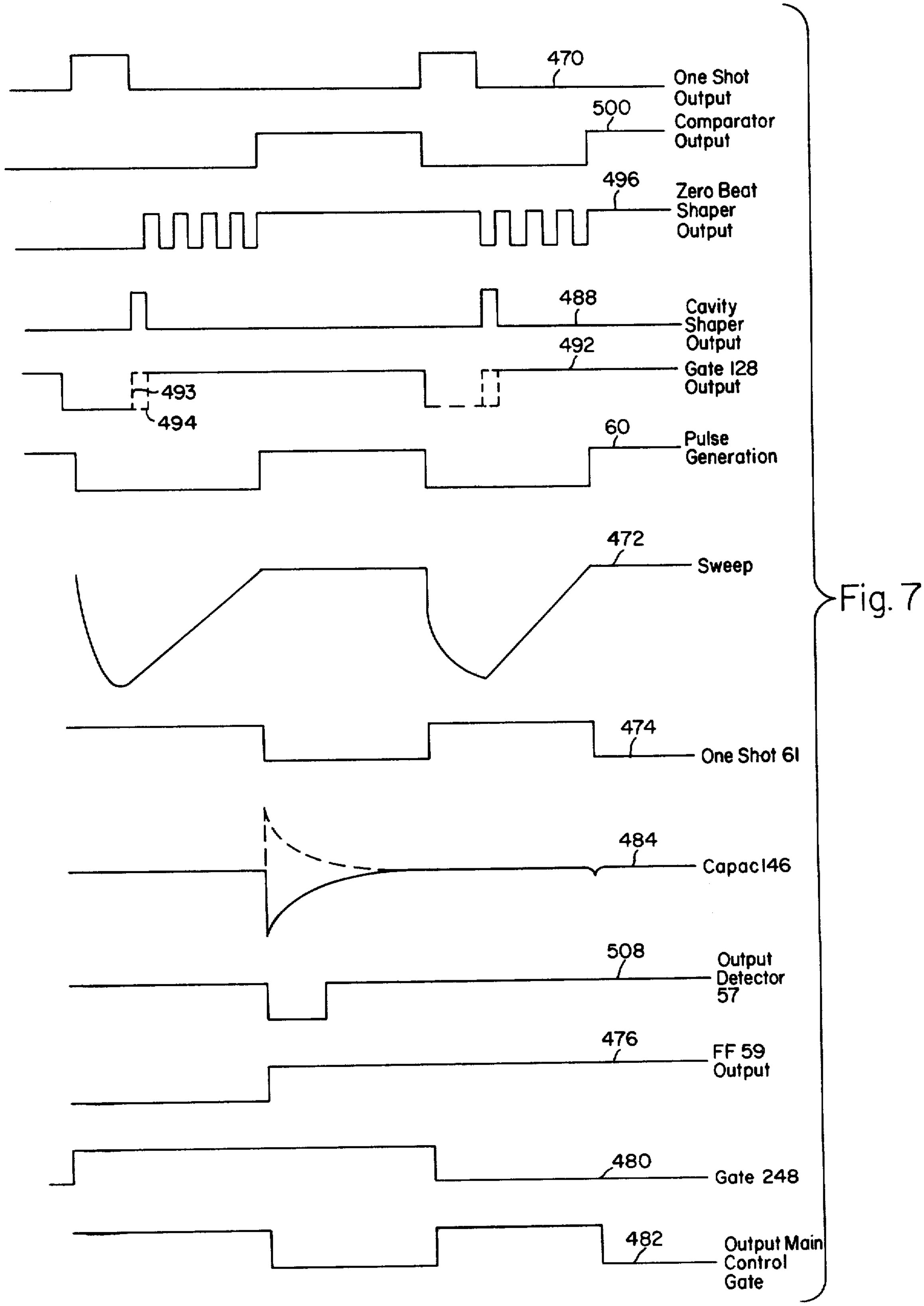
FIG. 7 is a diagram of waveforms of voltage and current as a function of time for further explaining the operation of the system of FIG. 1.

Referring now to the waveform of FIG. 7 as well as to schematic diagrams of FIGS. 1*a*, 1*b* and 1*c*, the operation of the system will be explained in further detail. The pulse generator 46 generates a pulse of the waveform 60 and the one shot circuit 66 responds to the trailing edge to generate a positive pulse of a waveform 470 on the lead 68 and an inverted form of the pulse (not shown) on the lead 70. The pulse on the lead 68 resets the counter 74 to 0 and the pulse applied to the lead 310 biases transistors 324 and 330 into conduction in the sweep generator 53 to reset the counter and lower the sweep voltage to a starting point as shown by a waveform 472. The pulse on the lead 70 guarantees reset of the flip-flop 59 as shown by a waveform 476 so that a low potential is applied to the lead 226. At the end of the first sweep interval, the one shot circuit output as shown by the signal of a waveform 474 on the lead 251, goes to a low level to provide a high pulse at the output of the gate 248 as shown by a waveform 480. The main control gate 106 maintains at a high level during the sweeping operation of the waveform 472 as shown by waveform 482 and the charge on the capacitor 146 is unchanged during the sweep as shown by a waveform 484.

In response to the trailing edge of the pulse of the waveform 470 the system does not start counting until the occurrence of the cavity pulse of a waveform 488. In response to the cavity pulse of the waveform 488 applied to the lead 126, the flip-flop 128 is set as shown by a waveform 492 at a time position 493, it being set at a position 494 if the ambiguity circuit 124 is set to the other condition. As the sweep of the waveform 472 continues having started, in response to the pulse of the waveform 470, each harmonic in a phase locked condition is applied to the lead 132 as shown by a waveform 496 to provide a control pulse to the gate 106 and to provide a count input on the lead 134 to the counter 74. When the comparator 82 determines an equality between the count in the counter 74 and the input code from the source 100, the comparator output on the lead 104 goes to a high level as shown by waveform 500.

At this time, the zero beat output of detector 51 is high, the output on the lead 104 is high and the output of the gate 248 is high so the output of the main control gate 106 on the lead 110 goes low to the locked condition and the sweep of the waveform 472 is terminated. The FET gate 280 open circuits and the sweep generator 53 stops and the gate 148 closes. The pulse generator 46 stops, the one shot circuit 61 is set, the pulse on the lead 251 goes low forcing the output of the gate 248 to go high which represents the locked condition for the system.

Upon closing of the gate 148 the current in capacitor 146 goes low or high momentarily as shown by the waveform 484 because the stored voltage at that time is different from the VCO control voltage on the lead 14. In response to the pulse of the waveform 484 the current pulse detectors 57 provides a negative pulse on the lead 220 as shown by the waveform 508 which is applied to the flip-flop 59 to set that flip-flop so that a high level voltage is applied to the lead 226. When the one shot pulse of the waveform 474 from the one shot circuit 61 ends, the two high levels at the input of the gate 248 causes the output to go low as shown by the waveform 480, breaking the locked condition and causing the output of the pulse generator 46 as shown by the waveform 60 to go low which in turn retriggers the one shot circuit 66 and the entire sweep and select operation starts again. The counter 74 is reset; the sweep generator 53 is reset; the flip-flop 59 is reset; the one shot circuit 61 is reset. Upon occurrence of the cavity pulse the flip-flop 128 is set and the zero beat detected pulses are applied through the gate 130 to the counter 74. When the count is sensed as being equal to the input code in the comparator 82, the output of the main control gate 106 goes low, the system is locked, the sweep generator is stopped, the pulse generator 46 is stopped, gate 280 is opened and the gate 148 is closed. As shown by the waveform 484, no substantial difference is present between the charge on the capacitor 148 and the sweep voltage on the lead 14. Thus a negative or positive pulse is not developed to cause the operation to occur again. However, if the system were locked up on the wrong harmonic or one different from that of the first sweep, then either a negative pulse or a positive pulse would occur on the lead 174 in response to the closing of the gate 148 to provide a pulse either negative or positive in the waveform 484 to restart the sweep operation. Thus, this repetitive sweep continues until the right harmonic has been obtained after two sequential sweeps indicating that it is the selected harmonic and not one that has been locked onto by the interference of transient noise.

During this and any other locked up condition the gate 148 remains closed so as to always check for any sudden or transient change or jump in the VCO control voltage which may be from noise or any other transient or variation for example, which upon occurrence thereof, will provide a pulse to set the flip-flop 59 and cause the output of the gate 248 to go into a low level and break lock. As a result the system will then repeat for two cycles, the entire sweeping and harmonic selection operation.

There has also been provided a manual reacquisition command input to the main control gate 106 which may be used to recheck the correctness of lockup any number of times. Each time this command signal goes low momentarily, the system breaks lock, reacquires, and rechecks for current flow in capacitor 146 in the manner described.

Upon selection of different references such as selection of references 28 or 30 operating at different frequencies, the harmonic spectrum changes and lockup may occur at any input code provided by the source 100, which codes may be predetermined and selected automatically or may be entered manually into the unit 100.

Thus there has been provided an improved frequency source that utilizes a voltage control oscillator with a phase lock loop and a control arrangement to cause the VCO to automatically lock on any selected harmonic of the reference source. The system also provides a guarantee that the harmonic locked onto by the VCO phase locked loop is the correct harmonic and continues its harmonic lock up operation until the same harmonic is locked onto for two consecutive control sweeps. The system also maintains a condition that guards against the effect of transient signals on the VCO control terminal such as noise transients and upon the occurrence thereof, goes into the harmonic lockup selection cycle to again lock upon the desired and selected harmonic, utilizing the two sweep selection system with an automatic comparison therebetween. The system allows assurance that the right frequency is used for operation such as in a radar system or communication system or in any type system where a very stable reference source is necessary with operation at one of the harmonics at a much higher frequency than that of the stable reference source. The system allows selection of any of a plurality of harmonics for any stable reference source and for any of the selected reference sources. The system in accordance with the invention is not to be limited to sweeping the voltage control oscillator to higher frequencies but may be arranged to sweep the voltage control oscillator to a lower frequency with proper rearrangement of the sweep voltage polarity and the selection of the marker cavity frequency.

What is claimed is:

1. A system for providing a stable frequency from a voltage controlled oscillator having a control input, an output and a phase comparator coupled between said output and said control input comprising:

counter means;

zero beat detector means coupled from the output of said phase comparator to said counter means;

cavity means coupled from the output of said voltage controlled oscillator to said counter means for starting said counter means to count the zero beat detections;

sweep generator means coupled to the input of said voltage controlled oscillator; and control means coupled to said sweep generator means and to said counter means for starting the sweep generator to apply a sweep signal to said voltage controlled oscillator and for terminating the sweep signal in response to a predetermined count provided by said counter means.

2. The combination of claim 1 in which said control means includes the comparator for comparing the count with an input code and upon an equality terminating the sweep signal.

3. The combination of claim 2 in which detecting means is coupled between said cavity means and said counter means for providing a pulse when the output frequency of said voltage controlled oscillator is equal to the cavity frequency to start the counter.

4. The combination of claim 3 in which said control means includes capacitor means coupled to the control input of said voltage controlled oscillator at the termination of each sweep to provide a reset pulse when the voltage at the control input is different than at the end of the previous sweep, said capacitor means being coupled to said control means to apply said reset pulse to initiate an additional sweep of said voltage controlled oscillator.

5. A system for providing a signal of a selected frequency comprising:

a voltage controlled oscillator having a control terminal and an output terminal;

a phase locked loop coupled between the output terminal and the control terminal of said voltage controlled oscillator and including a phase detector;

reference means coupled to said phase detector;

a sweep generator coupled to the control input of said oscillator;

a zero beat detector having an input and an output with said input coupled to said phase comparator;

a counter having an input gate coupled to the output of said zero beat detector;

a cavity coupled to the output of said voltage controlled oscillator;

a counter flip-flop coupled from said cavity to the input gate of said counter for being set in response to said cavity receiving a predetermined frequency at the output of said voltage controlled oscillator;

a source of a count code;

a digital comparator coupled to said counter and the code source and to said sweep generator for terminating the generations of a sweep voltage upon a predetermined comparison of the count from said counter and said count code;

a control flip-flop; and first control means coupled to said control flip-flop and said sweep generator for initiating a sweep voltage.

6. The combination of claim 5 further including capacitive means coupled to the control terminal of said voltage controlled oscillator and to said control flip-flop for resetting said flip-flop and causing said sweep generator to be actuated.

7. The combination of claim 6 in which said capacitive means includes a capacitor and a gate with said gate coupled between the control terminal of said voltage controlled oscillator and said capacitor and being response to said first control means to open upon the occurrence of a sweep and to close upon termination of a sweep, said capacitor charging to initiate a second sweep after termination of a first sweep.

8. The combination of claim 7 in which an ambiguity selection circuit is coupled between said cavity and said counter flip-flop for selectively setting said counter flip-flop on either the leading or trailing edge of a pulse derived from said cavity.

9. A system for controlling a voltage controlled oscillator having a control terminal and an output lead coupled to a phase locked loop to lock on a selected harmonic of a reference source comprising:

sweep generator means coupled to the control terminal of said oscillator;

cavity means coupled to the output lead of said voltage controlled oscillator for providing a pulse at a predetermined frequency;

counter means coupled to said phase locked loop and to said cavity means for counting the harmonics after occurrence of a pulse from said cavity means;

first control means coupled to said sweep generator means for starting a sweep; and second control means coupled to said sweep generator means and responsive to said counter for terminating said sweep at a predetermined count.

10. The combination of claim 9 in which said first control means includes capacitive means for holding a charge representative of the control potential at the beginning of a first sweep and initiating a second sweep if the potential varies a predetermined amount at the end of said first sweep.

* * * * *